United States Patent
Chaleix et al.

(10) Patent No.: US 12,270,094 B2
(45) Date of Patent: *Apr. 8, 2025

(54) STEEL SHEET PROVIDED WITH A ZINC COATING

(71) Applicant: ArcelorMittal SA, Luxembourg (LU)

(72) Inventors: Daniel Chaleix, Verny (FR); Isabelle Capitani, Monneren (FR); Eric Silberberg, Haltinne (BE); Sergio Pace, Jodoigne (BE); Bruno Schmitz, Nandrin (BE); Xavier Vanden Eynde, Latinne (BE)

(73) Assignee: ArcelorMittal, Luxembourg (LU)

( * ) Notice: Subject to any disclaimer, the term of this patent is extended or adjusted under 35 U.S.C. 154(b) by 9 days.

This patent is subject to a terminal disclaimer.

(21) Appl. No.: 15/934,638

(22) Filed: Mar. 23, 2018

(65) Prior Publication Data

US 2018/0209021 A1    Jul. 26, 2018

Related U.S. Application Data

(62) Division of application No. 14/908,014, filed as application No. PCT/IB2013/001681 on Aug. 1, 2013.

(51) Int. Cl.
*C23C 2/06* (2006.01)
*B32B 15/01* (2006.01)
(Continued)

(52) U.S. Cl.
CPC ............ *C22C 38/18* (2013.01); *B32B 15/013* (2013.01); *C22C 38/002* (2013.01); *C22C 38/02* (2013.01);
(Continued)

(58) Field of Classification Search
None
See application file for complete search history.

(56) References Cited

U.S. PATENT DOCUMENTS 4,637,840 A * 1/1987 Fujii ..................... B05D 7/14
148/251
4,649,860 A 3/1987 Furukawa et al.
(Continued)

FOREIGN PATENT DOCUMENTS

| CN | 1110195 A | 10/1995 |
|----|-----------|---------|
| CN | 1158366 A | 9/1997 |

(Continued)

OTHER PUBLICATIONS

B. Schmitz, R. Colin and M. Economopoulos, "Jet Vapor Deposition", a novel vacuum coating technique with superior properties, Revue de Metallurgie—Cahiers D'informations Techniques, Jul. 2000, pp. 971-978, vol. 97, No. 7/8, Revue de Metallurgie, Paris, France.

(Continued)

*Primary Examiner* — Mandy C Louie
(74) *Attorney, Agent, or Firm* — Davidson Kappel LLC

(57) ABSTRACT

A method for the fabrication of a coated sheet is provided. The method includes the steps of providing a sheet in a deposition chamber, maintaining the deposition chamber at a pressure $P_{chamber}$, maintaining an ejection chamber that is located inside the deposition chamber at a pressure $P_{eject}$ and coating the sheet with zinc with a sonic vapor jet. A ratio of the pressures $P_{chamber}$ to $P_{eject}$ is between $2 \cdot 10^{-3}$ and $5.5 \cdot 10^{-2}$.

1 Claim, 2 Drawing Sheets

(51) Int. Cl.

| | |
|---|---|
| *C22C 38/00* | (2006.01) |
| *C22C 38/02* | (2006.01) |
| *C22C 38/04* | (2006.01) |
| *C22C 38/06* | (2006.01) |
| *C22C 38/14* | (2006.01) |
| *C22C 38/18* | (2006.01) |
| *C22C 38/38* | (2006.01) |
| *C23C 14/16* | (2006.01) |
| *C23C 14/24* | (2006.01) |
| *C23C 14/56* | (2006.01) |
| *C23C 28/00* | (2006.01) |

(52) U.S. Cl.
CPC .............. *C22C 38/04* (2013.01); *C22C 38/06* (2013.01); *C22C 38/14* (2013.01); *C22C 38/38* (2013.01); *C23C 14/16* (2013.01); *C23C 14/24* (2013.01); *C23C 14/562* (2013.01); *C23C 28/32* (2013.01)

(56) References Cited

U.S. PATENT DOCUMENTS

| | | | |
|---|---|---|---|
| 4,650,724 | A | 3/1987 | Umino et al. |
| 5,531,839 | A | 7/1996 | Hosoya |
| 5,571,332 | A | 11/1996 | Halpern et al. |
| 5,834,128 | A | 11/1998 | Hamahara et al. |
| 5,855,696 | A | 1/1999 | Tezuka |
| 6,042,892 | A | 3/2000 | Kim et al. |
| 6,153,079 | A | 11/2000 | Klam et al. |
| 6,242,105 | B1 | 6/2001 | Joseph et al. |
| 6,524,458 | B2 | 2/2003 | Houziel et al. |
| 2003/0164298 | A1 | 9/2003 | Klein et al. |
| 2004/0022942 | A1 | 2/2004 | Schade van Westrum et al. |
| 2004/0118482 | A1 | 6/2004 | Steinmetz et al. |
| 2004/0118489 | A1 | 6/2004 | Sun |
| 2005/0031894 | A1* | 2/2005 | Klos ............. B32B 1/08 428/659 |
| 2006/0231177 | A1 | 10/2006 | Bano et al. |
| 2006/0269776 | A1* | 11/2006 | Tanaka ........... C23C 2/02 428/659 |
| 2009/0047542 | A1* | 2/2009 | Goto ............. B32B 15/013 428/648 |
| 2009/0053556 | A1* | 2/2009 | Sohn ............. B32B 15/012 428/659 |
| 2009/0274929 | A1 | 11/2009 | Sakamoto |
| 2010/0037993 | A1 | 2/2010 | Kim et al. |
| 2010/0104752 | A1* | 4/2010 | Choquet ......... C23C 14/16 427/250 |
| 2010/0285333 | A1 | 11/2010 | Kwak et al. |
| 2011/0000431 | A1 | 1/2011 | Banaszak et al. |
| 2011/0111255 | A1 | 5/2011 | Diez et al. |
| 2012/0070687 | A1* | 3/2012 | Shimoda ......... B32B 15/013 428/639 |
| 2013/0239890 | A1 | 9/2013 | Choquet et al. |
| 2016/0222495 | A1 | 8/2016 | Chaleix |
| 2016/0340771 | A1 | 11/2016 | Chaleix et al. |
| 2019/0233934 | A1 | 8/2019 | Chaleix et al. |

FOREIGN PATENT DOCUMENTS

| | | | | |
|---|---|---|---|---|
| CN | 1218845 | A | 6/1999 | |
| CN | 101575727 | A | 11/2009 | |
| CN | 101680080 | A | 3/2010 | |
| CN | 101910466 | A | 12/2010 | |
| EP | 0047987 | A1 | 3/1982 | |
| EP | 0630987 | A1 | 12/1994 | |
| EP | 2048261 | A1 | 4/2009 | |
| IN | 2010MU00494 | | 2/2010 | |
| JP | S57155371 | A | 9/1982 | |
| JP | S5983765 | | 5/1984 | |
| JP | S634057 | A | 1/1988 | |
| JP | S63171871 | A | 7/1988 | |
| JP | H0441683 | | 2/1992 | |
| JP | 2004504487 | A | 2/2004 | |
| KR | 890004043 | B1 | 10/1989 | |
| SU | 163193 | A | 12/1964 | |
| WO | WO9747782 | * | 12/1997 | ............ C23C 14/24 |
| WO | WO 2003076673 | A2 | 9/2003 | |
| WO | 2009095264 | A1 | 8/2009 | |

OTHER PUBLICATIONS

Galvinfo.com, GalvInfoNote 2.1, Jan. 2011, pp. 1-4. (Year: 2011).
Ranna et al., Low-density low-carbon Fe—Al ferritic steels, Oct. 13, 2012, Scipta Materialia, p. 354-359 (Year: 2012).
M. Maeda et al.: "Coatin weight ontrol in a zinc vapor deposition line," Iron and Steel Engineer, Sep. 1988, p. 41-47.
Schmitz et al.:"Jet vapour deposition (JV ): extensive product study and first evaluation of coupling with a processing line," European Commission, technical steel research, Report Finishing and Coating, EUR21783 EN, ISBN 92-894-9901-X, 2005, Jul. 2005 uploaded via EFS-Web in 2 parts.
Alcock et al.:"Vapor Pressure of the Metallic Elements," CRC Press LLC, 2000.
Smithells Metals Reference Book, Seventh Edition, 8.7 Vapo pressures, 8-54 to 8-56, ISBN 0 7506 3624 65 pages, allegedly published 1992.
M. Maeda et al., "Development of Zinc Physical Vapor Deposition Line", Technical Review, (19871000), vol. 24, No. 3, pp. 185-191.
M. Maeda et al., "The Product Made by a Zinc Vapor Deposition Line", TSAE transactions, vol. 95, 1986, pp. 179-184.
Electrophoretic deposition, Wikipedia; https://en.wikipedia.org/w/index.php?title=Electronic_deposition&oldid=562595880 ; page last edited on Jul. 2, 2013. Last accessed on Mar. 26, 2021.

* cited by examiner

STEEL SHEET PROVIDED WITH A ZINC COATING

CROSS REFERENCE TO RELATED APPLICATIONS

This is a divisional of U.S. patent application Ser. No. 14/908,014 filed Jan. 27, 2016, which is a national stage of international PCT/M2013/001681 filed Aug. 1, 2013, the entire disclosures of which are hereby incorporated by reference herein.

This invention relates to a steel sheet provided with a coating comprising a layer of zinc optionally covered by paint, which is intended in particular for the fabrication of automobile parts, although it is not limited to that application.

BACKGROUND

Galvanized coatings comprising essentially zinc are conventionally used for the effective protection they provide against corrosion, whether in the automotive sector or in the construction industry, for example.

In the following text, a zinc coating means a coating of pure zinc, potentially including the unavoidable impurities acquired during production and present in trace quantities.

Coils of steel coated in this manner can sometimes remain in storage warehouses for several months, and their surface must not be altered by the appearance of surface corrosion before they are shaped by the final user. In particular, no incipient corrosion may appear, whatever the storage environment, even if the steel is exposed to the sun and/or to a moist, humid or even saline environment. A layer of protective oil can also be applied to the surface of the steel coil to provide temporary protection in the event of storage in a moist or humid environment The methods most frequently used to deposit a zinc coating on the surface of a steel sheet are galvanizing and electrogalvanizing. However, these conventional methods do not make it possible to coat grades of steel that contain high levels of oxidizable elements such as Si, Mn, Al, P, Cr or B, which has led to the development of new coating methods, and in particular vacuum deposition technologies such as jet vapor deposition (JVD).

BRIEF SUMMARY OF THE INVENTION

Nevertheless, these vacuum coatings do not provide the same level of temporary protection as conventional coatings, even after application of a layer of protective oil.

An objection of the present invention is therefore to eliminate the disadvantages of steels coated using methods of the prior art by making available a steel sheet coated with zinc by vacuum deposition that offers good temporary protection against corrosion.

The present invention provides a steel sheet having good temporary protection against corrosion. The steel sheet has a coating which includes at least one layer of zinc, obtained by a jet vapor deposition method in which a ratio between the pressure inside the deposition chamber $P_{chamber}$ and the pressure inside the zinc ejection chamber $P_{eject}$ is between $2 \cdot 10^{-3}$ and $5.5 \cdot 10^{-2}$.

The sheet can also have the following characteristics, considered individually or in combination:

the steel sheet obtained by a method wherein the deposition chamber is maintained at a pressure $P_{chamber}$ between $6 \cdot 10^{-2}$ mbar and $2 \cdot 10^{-1}$ mbar;

the steel sheet obtained by a method wherein the distance d between the upper portion of the slot 8 of the ejection chamber 7 and the steel sheet to be coated is between 20 and 60 mm;

the zinc layer is the top layer of the coating; and the coated steel is a Very High Strength steel.

The present invention further provides a method for the fabrication of a coated sheet. The method includes the steps of coating the sheet by a sonic vapor jet of zinc via an ejection chamber 7 maintained at a pressure $P_{eject}$ and contained inside a deposition chamber maintained at a pressure $P_{chamber}$, the ratio of the pressures $P_{chamber}$ to $P_{eject}$ being between $2 \cdot 10^{-3}$ and $5.5 \cdot 10^{-2}$.

The method can also have the following characteristics, considered individually or in combination:

the deposition chamber is maintained at a pressure $P_{chamber}$ between $6 \cdot 10^{-2}$ mbar and $2 \cdot 10^{-1}$ mbar; and the distance d between the upper portion of the slot 8 of the ejection chamber 7 and the steel sheet to be coated is between 20 and 60 mm.

Additional characteristics and advantages of the invention are described in greater detail below.

BRIEF DESCRIPTION OF THE FIGURES

To illustrate the invention, tests have been conducted and will be described by way of non-restricting examples, in particular with reference to the accompanying figures, in which.

DETAILED DESCRIPTION

The sheet coated according to the invention first comprises a steel substrate, preferably hot-rolled then cold-rolled so that it can be used for the fabrication of automobile body parts. The invention is not limited to this field, however, and can be used for any steel part regardless of its intended final use.

The steel substrate can in particular be one of the following grades of a VHS (Very High Strength steel, generally between 450 and 900 MPa) or UHS (Ultra High Strength, generally greater than 900 MPa) steel, which contain high levels of oxidizable elements:

steels without interstitial elements (IF, Interstitial Free), which can contain up to 0.1% by weight Ti;

dual-phase steels such as DP 500 steels, up to DP 1200 steels, which can contain up to 3% by weight Mn in association with up to 1% by weight Si, Cr and/or Al;

TRIP (TRansformation Induced Plasticity) steels such as TRIP 780 steel, which contains, for example, approximately 1.6% by weight Mn and 1.5% by weight Si;

TRIP steels or dual phase steels containing phosphorus;

TWIP (TWinning Induced Plasticity) steels having a high content of Mn (generally 17-25% by weight);

low-density steels such as Fe—Al steels, which can contain up to 10% by weight Al, for example; and stainless steels, which have a high concentration of chromium (generally 13-35% by weight), in association with other alloy elements (Si, Mn, Al etc.).

The steel sheet can optionally be coated with one or more additional layers in addition to the zinc layer in a manner appropriate to the desired properties of the final product. The zinc layer will preferably be the top layer of the coating.

Figure 1:
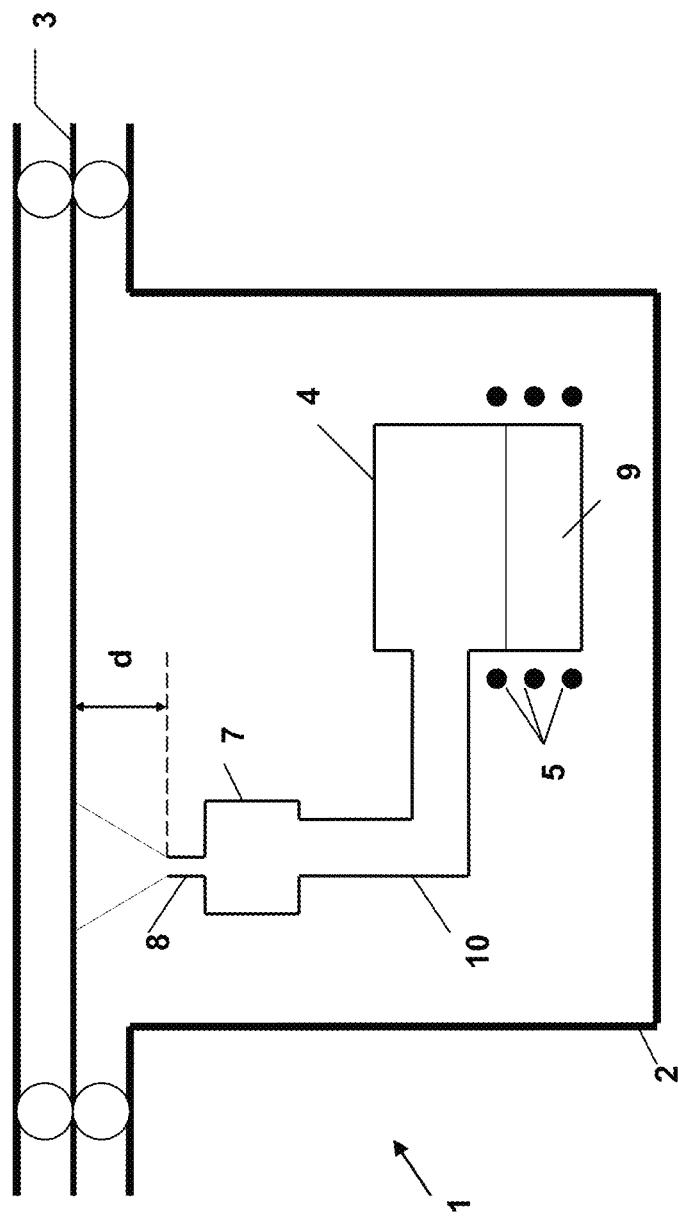
FIG. 1 illustrates a jet vapor deposition installation that can be used to carry out the method claimed by the invention.

A method for the fabrication of the steel sheet according to the invention is illustrated more particularly in FIG. 1, which shows an installation 1 that comprises a vacuum deposition chamber 2. This chamber comprises an entry lock and an exit lock, between which the steel sheet 3 to be coated circulates. The sheet 3 can be moved by any appropriate means, for example a rotating support roller on which the strip can be supported.

Located facing the surface of the strip to be coated is an ejection chamber 7 equipped with a slot 8, the upper part of the slot 8 being located at a distance d from the surface of the strip to be coated of for example, between 20 and 60 mm. This chamber 7 is mounted on an evaporation crucible 4 that contains the liquid zinc 9 to be deposited on the surface of the steel strip 3. The evaporation crucible 4 is advantageously equipped with an induction-heating device 5 that makes possible the formation of the vapor. The vapor then escapes from the crucible via a conduit 10 that conducts it to the ejection chamber 7 and the slot 8, which is preferably calibrated to form a jet directed toward the surface of the substrate to be coated. The presence of the slot 8 allows for the regulation of the mass flow of vapor, at a constant sonic speed along the slot (sonic throat) that has the advantage of achieving a uniform deposit. Reference to this technology is made below, using the acronym "JVD" (for Jet Vapor Deposition). Additional information on this technology is presented in patent EP07447056.

In another embodiment not illustrated, the crucible and the ejection chamber are one and the same part, comprising a slot directed toward the surface of the substrate to be coated. In this embodiment, the vapor created by heating the zinc rises directly toward the slot and forms a jet directed toward the surface of the substrate to be coated.

The pressure $P_{chamber}$ in the deposition chamber 2 and the pressure $P_{eject}$ in the ejection chamber 7 are maintained so that the ratio $P_{chamber}$ to $P_{eject}$ is between $2 \cdot 10^{-3}$ and $5.5 \cdot 10^{-2}$.

The pressure in the deposition chamber 2 is optionally maintained at a pressure between $6 \cdot 10^{-2}$ mbar and $2 \cdot 10^{-1}$ mbar to improve the surface appearance of the coating.

A layer of oil is then applied to the surface of the sheet thus coated to provide temporary protection when the sheet is stored in a moist, humid and/or saline environment before delivery or the transformation into the final product.

The sheet 3, which may or may not have been subjected to a skin-pass step, can then be cut and shaped, for example by stamping, bending or shaping, to form a part that can then be painted to form a paint film on the coating.

The invention will now be explained below on the basis of tests performed by way of non-restricting examples.

Tests

Surface Corrosion

The test performed is also called a "humidotherm test" and is conducted in a controlled-climate chamber as specified by DIN EN ISO 6270-2

The temporary protection against corrosion can be assessed on flat panels simulating a sheet during storage or transport, or on deformed panels representing a metal part (e.g. a vehicle door) stamped at one site and transported to another.

Each panel to be tested is de-greased, and then coated on both faces with an appropriate oil by means of an oil-spray device as specified by ISO 6270-2. The panels are oiled using Fuchs Anticorit RP 4107s, Fuchs 3802/395 or Zeller PL61 at 1.2 g/m² when the test is performed for a German automaker, or using Quaker Ferrocoat N 6130 at 1.2 g/m²±0.3 g/m² when the test is performed for a French automaker. The panels are left unassembled and unpainted.

A series of 24-hour aging cycles is then applied to the panels, each cycle including:

8 hours at 40° C.±3° C. and approximately 100% relative humidity (climate-controlled chamber closed, including during the heating), then 16 hours between 18° C. and 28° C. and at ambient humidity (climate-controlled chamber open or ventilated, including during cooling).

At the end of the series of cycles, the modification of the surface appearance of the panels is assessed in terms of percentage of the surface that has been altered.

The proportion of modification of the surface appearance must be less than 10% after 10 cycles for the specimens treated with the Quaker oil or after 15 cycles for the samples treated with one of the Fuchs oils or the Zeller oil.

Tests

Four series of cold-rolled IF steel sheet specimens, type DC06, of the type marketed by ArcelorMittal were produced, which comprise a zinc coating 7.5 μm thick. This coating was deposited using a jet vapor-deposition method.

For each of the specimens, the coating was applied with a different pressure ratio between the pressure in the deposition chamber $P_{chamber}$ and the pressure in the ejection chamber $P_{eject}$. The distance d between the upper part of the slot 8 of the ejection chamber and the surface of the strip to be coated is identical and equal to approximately 35 mm, and the pressure inside the ejection chamber 7 is approximately 3.4 mbar. The specimens coated as described above are then covered with protective oil and then subjected to a certain number of cycles.

The tests are carried out for 10 or 15 cycles, depending on the type of oil applied, but are interrupted before the end of the 10 or 15 cycles if the entire surface has been degraded.

TABLE 1

| Specimen | Type of oil |
| --- | --- |
| 1 | Quaker 6130 - 1.5 g/m² |
| 2 | Fuchs 4107 - 1.2 g/m² |
| 3 | Fuchs 3802/39 - 1.2 g/m² |
| 4 | Zeller Gmelin - 1.2 g/m² |

They are then subjected to the surface corrosion tests, the results are presented in table 2, with the ratio between the pressure $P_{chamber}$ in the deposition chamber and the pressure $P_{eject}$ in the ejection chamber being:

TABLE 2

| | Ratio $P_{chamber}/P_{eject}$ | | | |
| --- | --- | --- | --- | --- |
| Specimen | $2.9 \cdot 10^{-5}$ | $1.73 \cdot 10^{-2}$* | $3.23 \cdot 10^{-2}$* | $8.8 \cdot 10^{-2}$ |
| 1 | 100% after 6 cycles | <10% after 10 cycles | <10% after 10 cycles | 100% after 3 cycles |
| 2 | 20% after 15 cycles | <10% after 15 cycles | <10% after 15 cycles | 100% after 15 cycles |
| 3 | / | <10% after 15 cycles | <10% after 15 cycles | / |
| 4 | / | <10% after 15 cycles | <10% after 15 cycles | / |

*According to the invention

It has been found that the sheets coated according to the invention exhibit better surface corrosion resistance than a sheet that has not been coated according to the invention.

Figure 2:
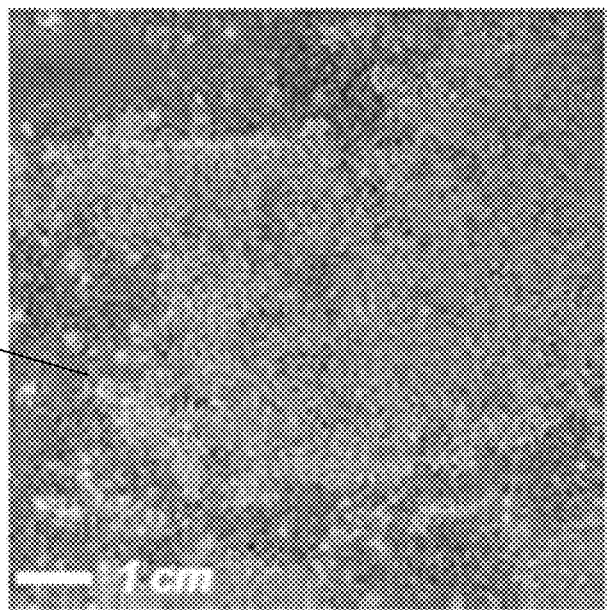
FIG. 2 is a full-scale photograph of a sheet coated according to the prior art.

FIG. 2 is a full-scale photograph of specimen No. 1 coated with a pressure ratio of $2.9 \cdot 10^{-5}$, after six aging cycles as described above. The figure shows that the entire surface of the sheet has altered 11 after six cycles.

Figure 3:
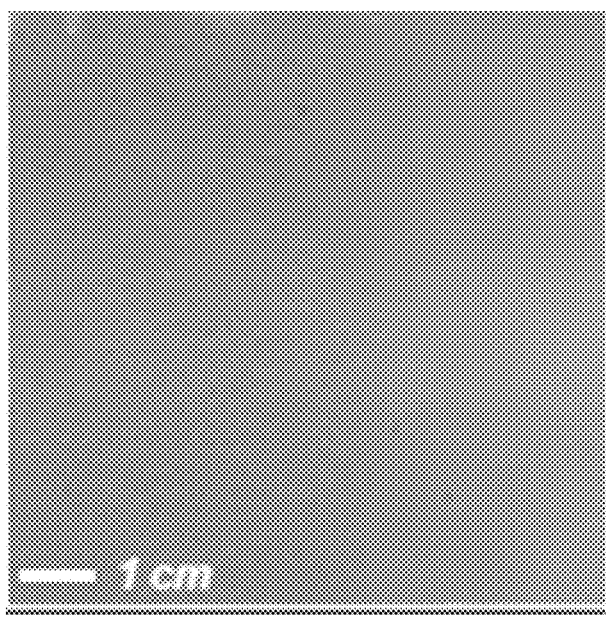
FIG. 3 is a full-scale photograph of a sheet coated according to the invention.

FIG. 3 is a full-scale photograph of specimen No. 1 as above but coated with a pressure ratio of $3.23 \cdot 10^{-2}$, after ten aging cycles as described above. The figure shows that the entire surface of the sheet is practically unaltered.

What is claimed is:

1. A method for the fabrication of a coated sheet comprising the steps of:
   providing a sheet in a deposition chamber;
   maintaining the deposition chamber at a pressure $P_{chamber}$;
   maintaining an ejection chamber that is located inside the deposition chamber at a pressure $P_{eject}$, a ratio of the pressure $P_{chamber}$ to $P_{eject}$ being between $2 \cdot 10^{-3}$ and $5.5 \cdot 10^{-2}$;
   coating the sheet with coating with a sonic vapor jet, wherein the coating consists essentially of zinc, and wherein the sonic vapor jet coats the sheet via jet vapor deposition; and
   wherein the pressure inside the ejection chamber is about 3.4 mbar.

* * * * *